(12) United States Patent
Dreyer et al.

(10) Patent No.: US 7,538,292 B2
(45) Date of Patent: May 26, 2009

(54) ACTIVATION DEVICE IN A MOTOR VEHICLE, CONNECTED TO A SYSTEM FOR OPERATOR DETECTION

(75) Inventors: Jürgen Dreyer, Schaafheim-Mosbach (DE); Peter Günther, Gross-Gerau (DE); Ralf Leupert, Hofheim (DE)

(73) Assignee: Siemens Aktiengesellschaft, Munich (DE)

( * ) Notice: Subject to any disclaimer, the term of this patent is extended or adjusted under 35 U.S.C. 154(b) by 173 days.

(21) Appl. No.: 11/361,002

(22) Filed: Feb. 24, 2006

(65) Prior Publication Data

US 2006/0212251 A1 Sep. 21, 2006

(30) Foreign Application Priority Data

Feb. 25, 2005 (DE) .................. 10 2005 008 791

(51) Int. Cl.
*H03K 17/975* (2006.01)
(52) U.S. Cl. ...................................... 200/600
(58) Field of Classification Search .................. 200/600
See application file for complete search history.

(56) References Cited

U.S. PATENT DOCUMENTS

| 5,201,410 | A | 4/1993 | Takano | |
|---|---|---|---|---|
| 6,078,549 | A * | 6/2000 | Wyatt et al. | 368/10 |
| 6,265,682 | B1 * | 7/2001 | Lee | 200/600 |
| 6,403,904 | B1 * | 6/2002 | Schilling | 200/600 |
| 6,545,236 | B2 | 4/2003 | Valk | |
| 6,667,563 | B2 * | 12/2003 | Bae et al. | 307/112 |
| 7,154,393 | B2 * | 12/2006 | Okushima et al. | 340/562 |
| 7,232,973 | B2 * | 6/2007 | Kaps et al. | 200/600 |
| 2002/0104746 | A1 | 8/2002 | Valk | |
| 2006/0289286 | A1 * | 12/2006 | Born et al. | 200/600 |

FOREIGN PATENT DOCUMENTS

| DE | 29 12 686 A1 | 10/1980 |
|---|---|---|
| DE | 41 29 938 A1 | 3/1992 |
| DE | 199 31 766 A1 | 1/2001 |
| DE | 201 03 004 U1 | 8/2001 |
| DE | 102 04 856 A1 | 8/2002 |

* cited by examiner

*Primary Examiner*—Elvin G Enad
*Assistant Examiner*—Lheiren Mae A Anglo
(74) *Attorney, Agent, or Firm*—Laurence A. Greenberg; Werner H. Stemer; Ralph E. Locher

(57) ABSTRACT

The invention relates to an activation device for operating an electronic system in a motor vehicle, which has an electrically conductive sensor face for electrically coupling an operator to a system for operator detection. According to the invention, the sensor face is formed by the entire external surface, which can be touched by the operator, of the activation device by virtue of the fact that the external surface is of electrically conductive design.

10 Claims, 2 Drawing Sheets

ABSTRACT / PATENT TEXT:

ACTIVATION DEVICE IN A MOTOR VEHICLE, CONNECTED TO A SYSTEM FOR OPERATOR DETECTION

CLAIM FOR PRIORITY

This application claims priority to German Application No. 10 2005 008 791.4, filed Feb. 25, 2005 incorporated herein, in its entirety, by reference.

TECHNICAL FIELD OF THE INVENTION

The invention relates to an activation device for operating an electronic system in a motor vehicle, which has an electrically conductive sensor face for electrically coupling an operator to a system for operator detection.

BACKGROUND OF THE INVENTION

DE 43 01 160 A1 discloses a system for operator detection, in which in the driver's seat and in the front passenger's seat as well as in at least one operator control element there are electrical coupling elements which close a transmission path for an electrical signal via the person located on the respective seat when the operator control element is touched. The electrical signal is fed to an evaluation circuit and it is detected there whether the driver or the front seat passenger has touched the operator control element. In one embodiment, the differentiation between the persons is effected by means of different frequencies, for example 20 and 25 kHz, which are applied to the coupling element in the vehicle seats by means of signal generators. A keypad, a lever and a telephone receiver are considered to be operator control elements and it is proposed that the operator control elements have sensor faces which, when activated, are touched by the operator in a conductive fashion. However, DE 43 01 160 A1 does not contain any more detailed considerations of the way in which the sensor faces are embodied.

SUMMARY OF THE INVENTION

The present invention discloses an activation device with which reliable closing of the electrical transmission path within the system for operator detection can always be ensured.

According to one embodiment of the invention, the entire external surface, which can be touched by the operator of the activation device, is of electrically conductive design so that the external surface serves completely as a sensor face for coupling the operator to the system for operator detection. Irrespective of the location at which the operator touches the activation device, and the pressure he applies, a reliable connection to the detection system is always established. The operator does not need to ensure that he selectively touches individual sensor faces or coupling elements.

In one aspect of the invention, the external surface of the activation device is provided with an electrically conductive coating, such as an electrically conductive surface coating agent or an electrically conductive plastic layer. This coating can be applied without a particularly large amount of effort at the end of the process for manufacturing the activation device.

In another aspect of the invention, an activation element which has the external surface, for example a push button key or a rotary knob, is manufactured from an electrically conductive material, preferably a conductive plastic. The coating process is accordingly eliminated.

In the coated activation devices there is provision, in one development, that not only an electrically conductive plastic layer, but at the same time a transparent plastic layer, is used. This is appropriate in particular in the case of touch screens and touch pads. The generally customary manner of detecting the sensor layer which serves as a touch position or activation position is separated for this purpose from the electrically conductive plastic layer forming the external surface by means of an insulation layer. In this way, the function of the operator detection and the position detection can be integrated simultaneously into one activation device with a touch function.

In another embodiment of the coated activation device, it includes an activation element which has the external surface and which is coated conductively not only on the external surface but also in which the coating also extends to at least one side face and/or internal face of the activation element. Significantly, the coating on the external surface extends integrally with the side face coating or internal face coating, that is to say it is possible to bring about a continuous conductive connection from the external surface to the side face and/or internal face. This facilitates the formation of electrical contact with the activation element since, for example, there is no longer any need to form a hole in the activation element in order to reach the conductive external coating from a printed circuit board located underneath the activation device by means of an electrical connection. Instead, contact can be made conveniently via the side face and/or internal face.

In one preferred embodiment, the contact is made by means of an electrically conductive contact element with a contact face, which element is electrically connected to the system for operator detection and along whose contact face the side face and/or internal face of the activation element is guided in sliding contact during an activation. This refinement is provided both on the activation elements which are coated on the outside and those which are coated on the sides or on the inside as well as on the activation elements which are entirely composed of a conductive material. In this embodiment, the contact element should be made as rigid or resilient as possible in order to maintain the sliding, and thus electrically effective contact, with the activation element during the entire activation process. Alternatively, the contact element, for example a spring slider, could also be permanently connected to the activation element and, during the activation, could slide along a contact face which is connected to the operator detection system, said contact face being, for example, on a printed circuit board.

In one further preferred embodiment, the contact element is simultaneously active as a guide element for guiding the activation element during the activation. Close mechanical and thus also electrical contact is thus ensured.

BRIEF DESCRIPTION OF THE DRAWINGS

The invention will be explained in more detail below with reference to an exemplary embodiments and the drawings, in which.

DETAILED DESCRIPTION OF THE INVENTION

Figure 1:
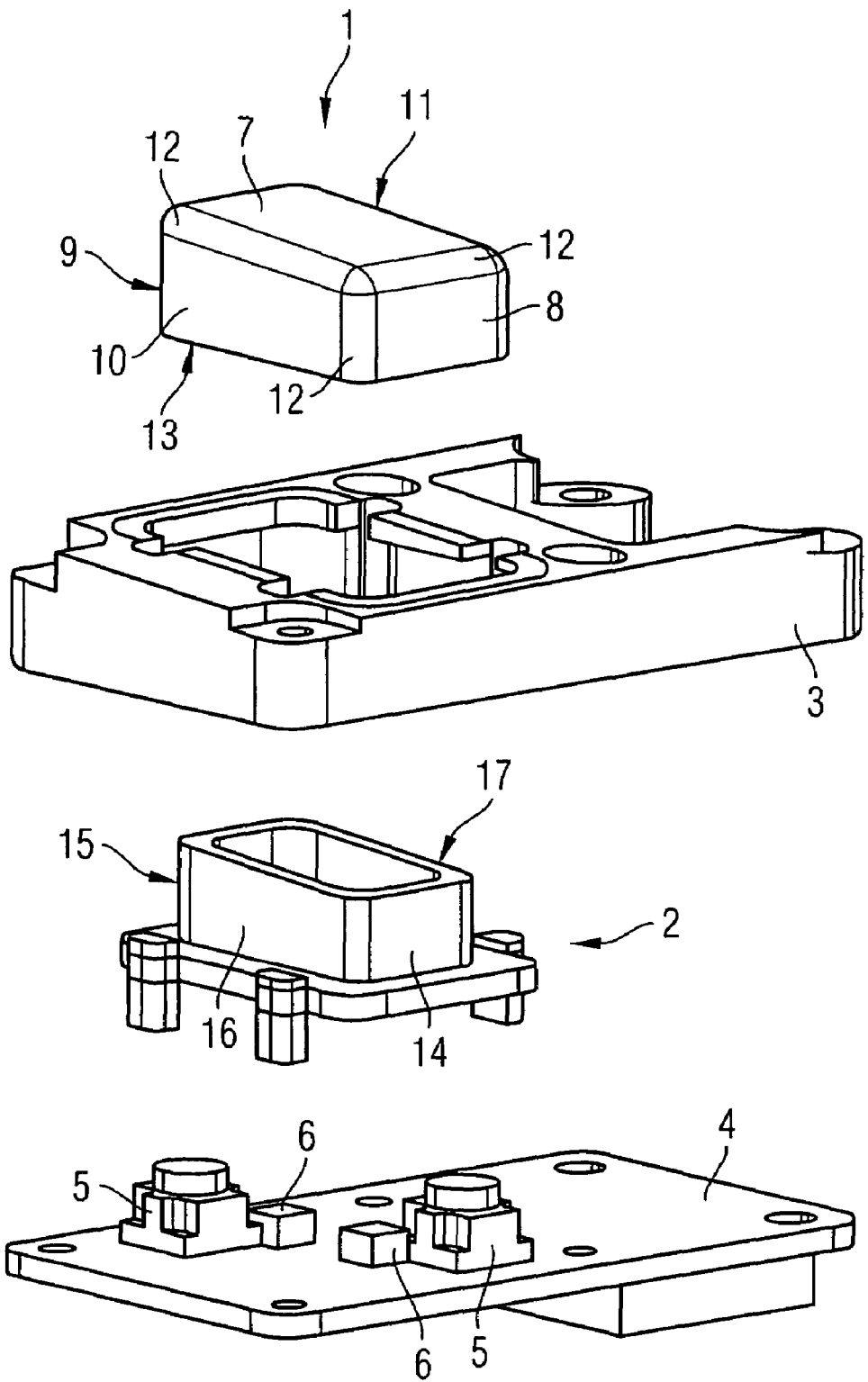
FIG. 1 is an exploded view of an activation device with an activation element and guide element.

FIG. 1 is an exploded illustration of an activation device composed of an activation element 1 and a guide element 2.

Furthermore, an attachment element 3 and a printed circuit board 4 with electronic components 5 and 6 are illustrated.

The activation element 1 is a push button key which is formed by an approximately cuboid hollow element made of plastic which is open on the underside. The entire external surface of the activation element 1 is coated with an electrically conductive surface coating agent, in which case the external surface is formed by the cover face 7, the end face 8, the rear face 9, the side faces 10 and 11 and the rounded edges 12 which connect individual faces 7 to 11 to one another. The electrically conductive surface coating agent covers both the external surface and the internal faces which lie respectively opposite the faces 7 to 11 and the edges 12 in the interior of the hollow element, as well as the lower edges 13 which are present on the open underside. The conductive coating thus extends continuously over the external and internal surface of the activation element 1.

When activation occurs, that is when the activation element 1 is moved in the direction A owing to an operator correspondingly touching the activation element 1, the activation element 1 is guided in its movement by the guide element 2. The guide element 2 is of a rigid design and is composed of an electrically conductive material, preferably metal. In the assembled state (FIG. 2), it is connected electrically via the printed circuit board 4 to a system (not illustrated) for operator detection, in which case the connection can comprise a galvanic or capacitive coupling to the system. During the activation, the internal faces of the activation element 1 which lie opposite the end face 8, the rear face 9 and the side faces 10 and 11 respectively move along the associated external face 14, 15, 16 and 17 of the guide element 2, in which case the internal faces are in continuous mechanical and thus electrical contact with the respective external face 14 to 17. This ensures that during the activation signals can be transmitted between the system for operator detection and the operator who is touching the external surface of the activation element 1. The transmission of signals is carried out here either by a signal generator which is specifically assigned to the operator, for example integrated into a seat, via the activation device to form a general evaluation circuit, or from a general signal generator, assigned to the activation device, to form an evaluation circuit which is specifically assigned to the operator.

Figure 2:
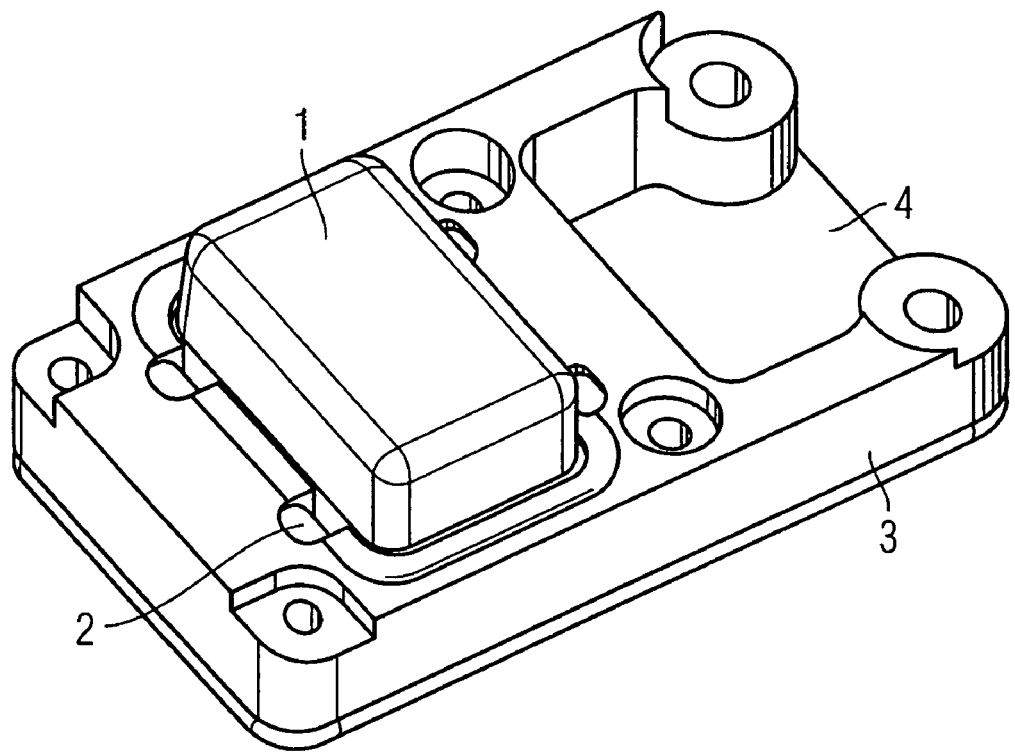
FIG. 2 shows the activation device from FIG. 1 in the assembled state.

The operator arrangement comprised of the activation element 1, guide element 2, attachment element 3 and printed circuit board 4 is illustrated in the assembled state in FIG. 2. It is clearly apparent that the external surface can be reached from all sides and can thus be touched by an operator. Owing to the conductive coating on all sides it is now possible to reliably detect any contact.

What is claimed is:

1. An activation device for operating an electronic system in a motor vehicle, comprising:
    an activation element formed with a sensor face for electrically connecting an operator to a system for operator detection, a side face, and an internal face;
    wherein said sensor face, said side face, and said internal face are provided with an electrically conductive coating and wherein said conductive coating is to be touched by the operator for connecting to the system for operator detection; and
    an electrically conductive contact element having at least one contact face electrically connected to the system for operator detection, and wherein said activation element is guided along said at least one contact face, with said side face and/or said internal face of said activation element being in sliding contact with said contact face during an activation.

2. The activation device as claimed in claim 1, wherein said contact element simultaneously serves as a guide element for guiding the activation element during the activation.

3. An activation device for operating an electronic system in a motor vehicle, comprising:
    an activation element formed with at least one electrically conductive external sensor face; and
    a guide element for electrical connection to a system for operator detection;
    wherein the activation element mechanically contacts the guide element and is movably guided by the guide element; and
    wherein, when an operator touches the external sensor face of the activation element and causes the activation element to move with respect to the guide element, the external sensor face of the activation element and the guide element are electrically connected for galvanically connecting the operator to the system for operator detection.

4. The activation device as claimed in claim 3, wherein the external sensor face of the activation element includes an electrically conductive coating.

5. The activation device as claimed in claim 4, wherein the coating is an electrically conductive surface coating agent.

6. The activation device as claimed in claim 4, wherein the coating is an electrically conductive plastic layer.

7. The activation device as claimed in claim 6, wherein the plastic layer is transparent.

8. The activation device as claimed in claim 4, wherein the activation element includes an internal face and the conductive coating also extends over the internal face of the activation element.

9. The activation device as claimed in claim 3, wherein the activation element is made of an electrically conductive material.

10. The activation device as claimed in claim 3, wherein the guide element includes a face for being electrically connected to the system for operator detection, and the activation element includes an internal face that electrically contacts the face of the guide element and that is slidably guided on the face of the guide element.

* * * * *